United States Patent [19]

Bandura et al.

[11] Patent Number: 4,586,237
[45] Date of Patent: * May 6, 1986

[54] DRIVE MECHANISM FOR A CUT AND CLINCH UNIT

[75] Inventors: Vitaly Bandura, Danvers; Robert J. Sooy, Marblehead, both of Mass.

[73] Assignee: USM Corporation, Framington, Conn.

[*] Notice: The portion of the term of this patent subsequent to May 14, 2002 has been disclaimed.

[21] Appl. No.: 536,681

[22] Filed: Sep. 28, 1983

[51] Int. Cl.4 ............................................... B21F 1/00
[52] U.S. Cl. .................................. 29/566.3; 29/564.8; 29/715; 29/741; 140/105; 227/79
[58] Field of Search ...................... 29/566.1, 566.3, 566, 29/731, 741, 715; 140/105; 227/79

[56] References Cited

U.S. PATENT DOCUMENTS

| 3,593,404 | 7/1971 | Ragard | 29/566.1 X |
| 4,165,557 | 8/1979 | Taguchi et al. | 29/566.3 |
| 4,309,808 | 1/1982 | Dean et al. | 29/566.1 |
| 4,516,310 | 5/1985 | Bandura | 29/566.3 |

Primary Examiner—Z. R. Bilinsky
Assistant Examiner—Glenn L. Webb
Attorney, Agent, or Firm—Alan N. McCartney

[57] ABSTRACT

A cut-clinch mechanism for cutting and forming the leads of electronic components inserted into the openings in a printed circuit board, the mechanism having a fixed cut-clinch head supporting a movable cut-clinch head with a bi-directional drive means for incrementally moving the heads toward and away from one another to accommodate variable spaced component leads.

8 Claims, 2 Drawing Figures

DRIVE MECHANISM FOR A CUT AND CLINCH UNIT

BACKGROUND OF THE INVENTION

1. Field of the Invention

A mechanism for cutting and clinching the leads of electrical components inserted into the openings in printed circuit boards, the mechanism including a drive means for the cut and clinch heads to enable variable spaced leads of the components to be cut and clinched.

2. Statement as to Prior Art

In the assembly of electrical components to printed circuit boards, for a given board circuit, a plurality of components must be applied that have different dimensions and thus different spacings between the leads of the components. The component leads are either manually or automatically inserted into preselected holes in the board. After the leads are inserted into the board, a cutting and clinching unit positioned below the board will cut off the excess lead and bend or form (clinch) the remaining lead to securely attach the component to the board. After all the necessary components have been assembled to the board, the entire assembly will go through a wave solder process to complete the board assembly.

This assembly process can be semi-automatic by the operator having components supplied in a preselected sequence through a programed supply source such as illustrated in U.S. Pat. No. 4,273,393. With the board fixed to a station available to the operator, the preselected component is inserted into the board at a location identified to the operator and a cut-clinch unit, programed to cut and clinch the preselected component, is activated by the operator to move into position and cut and clinch the component leads to temporarily attach the component to the board. Examples of such cut-clinch units are illustrated in U.S. Pat. Nos. 4,288,914 and 4,292,727. Additionally, such cut-clinch units are moved toward and away from the board and can rotate with respect to the board since the angular disposition of the components inserted into the board vary with respect to one another. An example of this type of unit is illustrated in U.S. Pat. No. 4,153,082.

The above types of cut-clinch units, however, have not been designed so that the cut-clinch mechanism can automatically accommodate components having variable spaced leads and perform the cut-clinch function on incrementally variable spaced leads in response to a programed control.

SUMMARY OF THE INVENTION

A cut-clinch mechanism for cutting and forming the leads of electrical components having leads inserted into openings in printed circuit boards, the mechanism having a fixed cut-clinch head and a movable cut-clinch head, the heads being carried on a piston and cylinder mechanism mounted to a spider on the component assembly machine.

It is a further object of this invention to provide a mounting means for a cut-clinch unit so that the cut clinch unit can be moved toward and away from the printed circuit board.

It is another object of this invention to rotationally mount a cut-clinch unit on a spider so that the cut-clinch unit can be rotated 90° increments to accommodate cutting and clinching the leads of components having varying angular disposition.

It is an additional object of this invention to provide a rack on a movable cut-clinch head controlled by a pinion that can be rotated to incrementally position the movable head with respect to a fixed cut-clinch head to accommodate components with variable center distance spacing between the component leads.

It is also an object of this invention to provide an electrical component cut-clinch unit adapted to cut and clinch component leads with variable center distances; the unit having a movable head mounted on a fixed head, the movable head being driven by a rack and pinion through a bi-directional drive to incrementally space the heads from one another. The fixed head is carried on a piston mounted in a cylinder for movement of the heads toward and away from a printed circuit board. The cylinder is mounted on a support for rotational movement to rotate the heads to accommodate cutting and clinching leads of components having varying angular disposition.

DESCRIPTION OF PREFERRED EMBODIMENT

Figure 1:
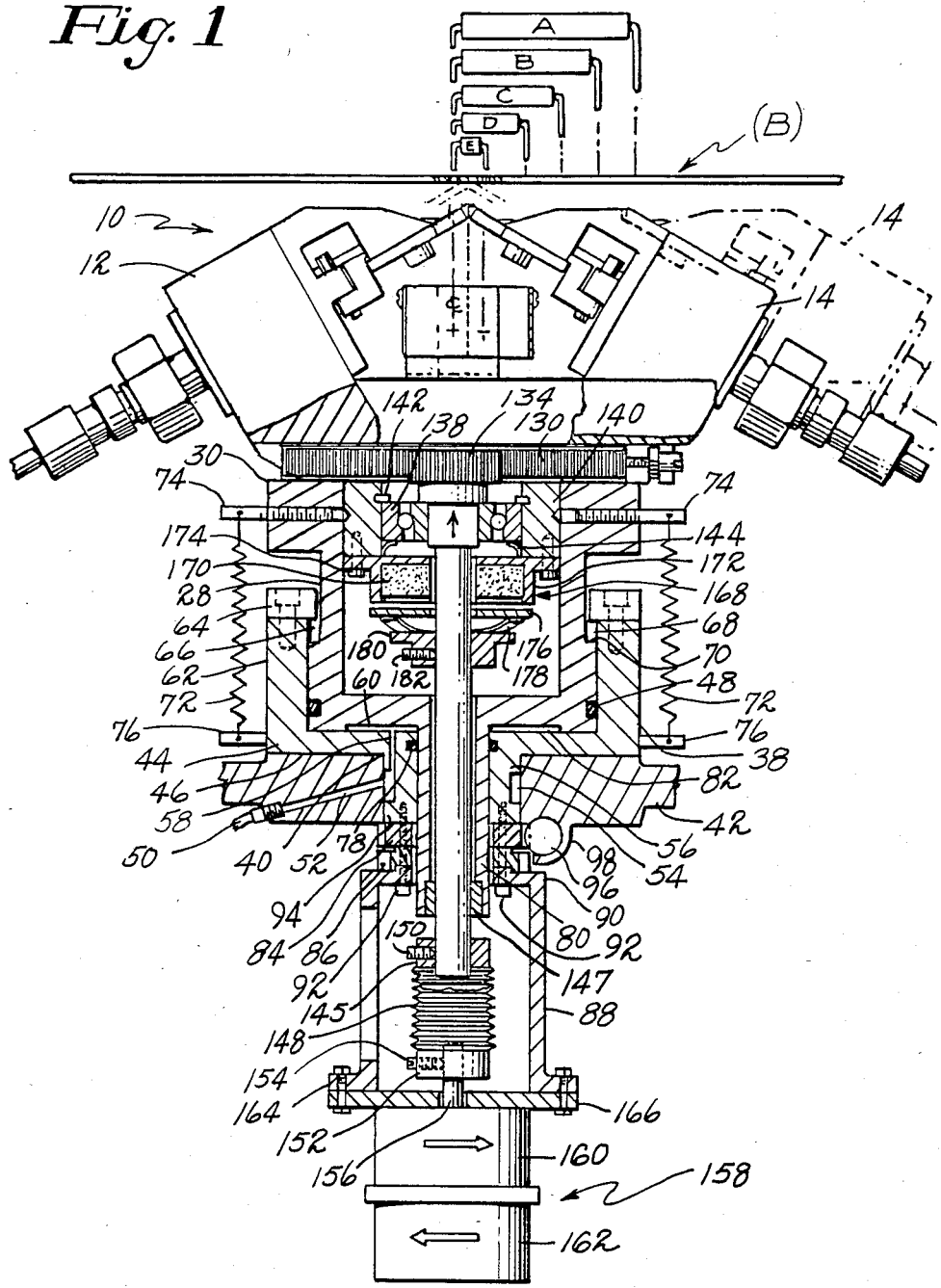
FIG. 1 is a side elevational view of the cut-clinch unit, partially in section, positioned adjacent the printed circuit board and illustrating the various components with their respectively spaced leads which can be assembled to the board.

Attention is now directed to FIG. 1 of the drawings which illustrates the cut-cinch mechanism 10 having a fixed head 12 and movable head 14 positioned below the printed circuit board (B) to cut and clinch the leads of components extending through the openings in the board (such as components A to E are illustrated in FIG. 1). The fixed head 12 has a pair of flanges 16 upon which rails 18 are mounted. The movable head 14 has flanges 20 carrying rails 22 that engage rails 18 so that the heads 12 and 14 can move toward and away from one another. This mounting of the heads and the operation of the cut-clinch portions of the head is disclosed in more detail in copending U.S. patent application Ser. No. 469,788, filed Feb. 25, 1983 and assigned to the assignee of this application. For the purposes of this application, the disclosure of U.S. patent application Ser. No. 469,788 concerning the head mounting and operation of the cut-clinch units is incorporated herein by reference. Note should also be taken that this mechanism also contains light sources 24 and mirrors 26 to identify for the operator the particular openings in the board into which the particular component leads are to be inserted. This feature is also discussed in more detail in U.S. patent application Ser. No. 469,788.

Figure 2:
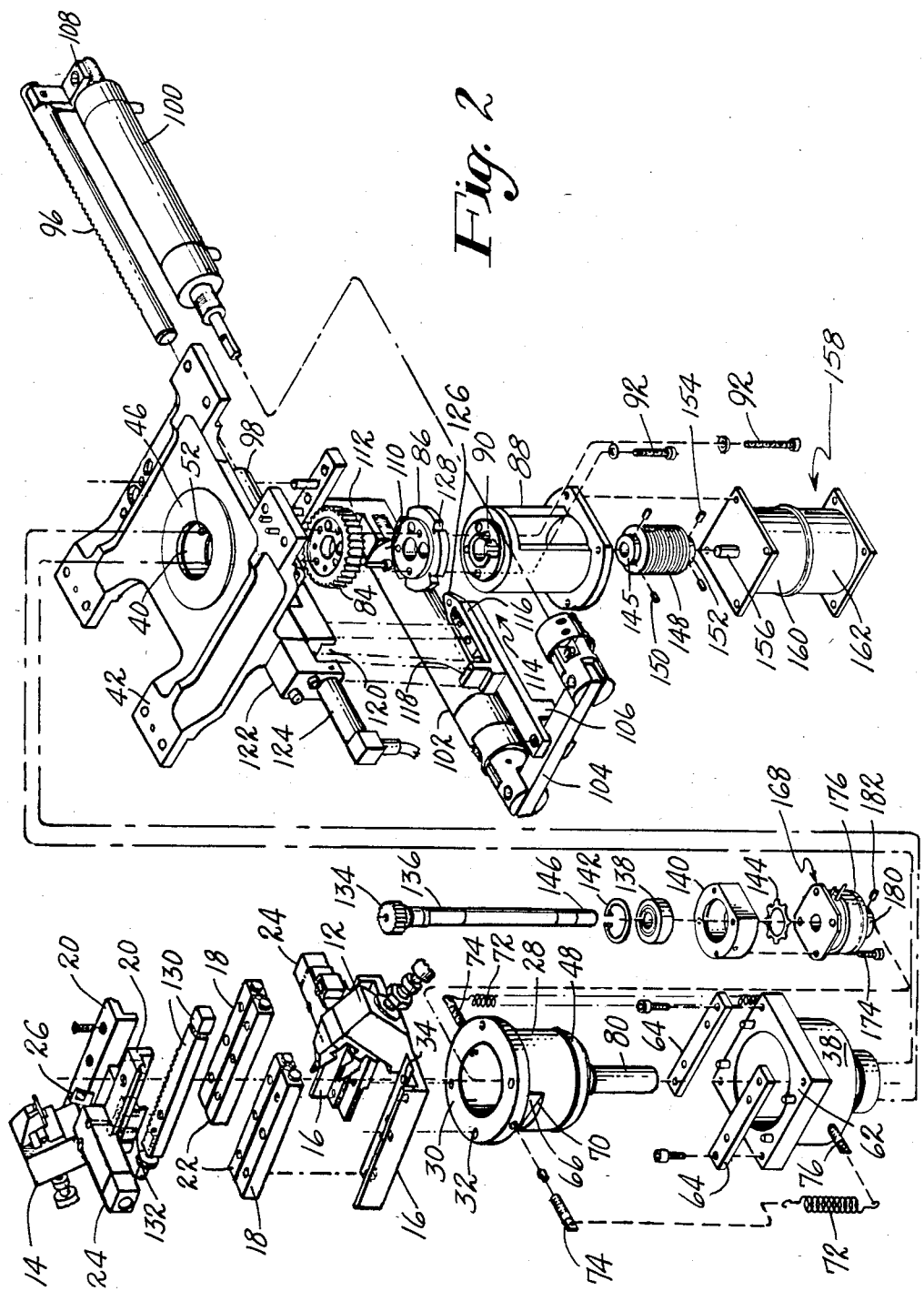
FIG. 2 is an exploded view of the cut-clinch mechanism of this invention.

Attention is now directed to FIG. 2 which illustrates in exploded view the mounting for the cut-clinch mechanism that enables the heads 12 and 14 to be moved toward and away from the board (B), rotated at 90° increments and positions the movable head 14 with respect to the fixed head 12 all under a programed control.

The fixed head 12 is secured to a cup shaped piston 28. The piston 28 has a circumferential flange 30 secured to the flange 16 through a plurality of openings 32 on flange 30 and openings 34 on flange 16. Locating pins 36 on flange 30 are positioned in openings (not shown) in flange 16 to align the openings 32 and 34. The piston 28 is carried in a cup-shaped cylinder 38 which is positioned in the opening 40 in the spider 42. The bottom 44 of the cylinder 38 has a bearing engagement with the surface 46 of the spider 42 (see FIG. 1) so that the cylinder 38 can rotate with respect to the spider 42 for reasons that will become apparent hereinafter.

The piston 28 is sealed within cylinder 38 by means of an O-ring 48. An air line 50 passes through the opening 52 in spider 42 and into recess 54 around the collar portion 56 of the cylinder that is received within opening 40 of spider 42. The air pressure can then pass through the additional opening 58 in collar 56 and underneath the piston in the recessed area 60. This air pressure will move the piston 28 upwardly to move the cut-clinch heads upward to an operative position beneath the board (B). The flange 62 of the cylinder 38 receives plates 64 positioned within the notches 66, 68 on the sides of the piston 28. This plate and notch connection between the piston and cylinder permits the piston to move upwardly from the position shown in FIG. 1 to a position wherein the cut-clinch heads are under the board. At that time, the plates 64 will bottom out on the bottom 70 of notches 66, 68 limiting further upward movement of the piston 28. A pair of return springs 72 are positioned between the pins 74 on piston 28 and pins 76 on cylinder 38 to return the piston to the lower position (head lowered position) after the cut-clinch operation on a given component has been performed. In this manner the cut-clinch heads are free from interfering with the next component insertion operation in the assembly sequence.

An additional O-ring 78 surrounds collar 80 of piston 28 to seal the chamber 82 between the piston 28 and cylinder 38.

Surrounding the collar 80 is a pinion gear 84 and centering gear 86, a housing 88 has a flange 90 and bolts 92 pass through flange 90, pinion gear 84 and centering gear 86 and into the lower end 94 of collar 56 on cylinder 38.

A rack 96 is carried in an opening 98 in spider 42 and is controlled for back and forth movement to rotate the pinion gear 84 and thus the cylinder 38 and the cut-clinch heads with respect to the board to accommodate component leads having different angular dispositions on the board.

The positioning of the rack 96 is controlled by cylinders 100 and 102 carried on a yoke 104. The yoke 104 is pivoted on a bracket 106 secured to the underside of the spider 42. The end 108 of cylinder 100 is secured to the rack and the end 110 of cylinder 102 is carried in a bracket 112 secured to the underside of the spider 42. Actuation of either cylinder 100 or 102 will pivot yoke 104 and move the rack 96 on pinion 84 causing rotation of cut-clinch mechanism. This rotational positioning of the cut-clinch mechanism is in 90° increments.

To assure that this drive for the cut-clinch mechanism is stopped and held at accurate 90° increments, a centering mechanism 114 is provided. A bracket 116 is slidably carried on bracket 106 and has a nosepiece 118 carried in the space 120 between the bracket 122 and the spider 42. An air cylinder 124 acts against nosepiece 118 to slide bracket 116 portion 126 into the required notch 128 in locating disc 86 to accurately position the cut-clinch mechanism in 90° increment and lock same in that position.

The mechanism for incrementally positioning the movable cut-clinch head 14 with respect to the stationary head 12 includes a rack and a pinion drive. The rack 130 is secured to bracket 132 on the underside of flange 20 of the movable head 14. The pinion 134 is on a shaft 136 that passes down through the piston 28, cylinder 38 and housing 88 (see FIG. 1). The shaft 136 is positioned in a bearing 138 held in a collar 140 by retaining rings 142, 144. The collar 140 is secured to the flange 30 of piston 28 by set screws (not shown) located in the openings receiving pins 74. The lower end 146 of pinion shaft 136 is positioned in a sleeve bearing 147 pressed into collar 80. The pinion shaft 136 is secured to the collar 145 of a flexible drive coupling 148 by lock screw 150. The lower collar 152 of the coupling 148 is secured by lock screw 154 to the shaft 156 of a bi-directional drive 158 comprising a pair of rotary solenoids 160, 162. The drive 158 is secured through the interconnection of the flange 164 on housing 88 and the flange 166 on the drive. It can thus be seen with the above described drive for the movable head, a programed energizing of either solenoid 160, 162 will rotate the pinion 134 and move the rack 130 and movable head to the predetermined required increment of spacing to properly space the cut-clinch heads for a given component lead spacing in the component assembly sequence.

Due to the force required in the direction of the inward clinch of the component leads, there is a certain amount of reaction force tending to separate the cut-clinch heads. To assure that the heads do not move with respect to one another in the clinch operation, a brake mechanism 168 surrounds shaft 136 and locks the pinion against rotation.

The brake mechanism 168 comprises a magnet 170 carried in a housing 172 secured to the collar 140 by bolts 174. A plate 176 is secured by a set of leaf springs 178 to a collar 180 secured by set screws 182 to the pinion shaft 136. When the pinion shaft 136 is in the desired position of rotation (and thus the heads properly spaced), the magnet 170 is energized pulling the plate 176 against housing 172 to lock the plate 176 and thus the collar 180 and shaft 136 against rotation.

It can thus be seen that the drive mechanism described can move the cut-clinch heads toward and away from the board and rotate the heads 360° to accommodate the varying angular disposition of the component leads inserted into the board. Further, the movable head can be incrementally indexed toward or away from the fixed head to accommodate variable center spacing of the components assembled to the board.

We claim:

1. A mechanism for cutting and clinching variable spaced leads of electronic components inserted into the openings in printed circuit boards comprising:
   a. a support means;
   b. a cylinder mounted on said support means;
   c. a piston mounted in said cylinder;
   d. a fixed cut and clinch head mounted on said piston;
   e. a movable cut and clinch head mounted on said fixed head for movement toward and away from said fixed head to accommodate cutting and clinching variable spaced component leads;
   f. a rack carried on said movable head and a pinion mounted on a driven shaft passing through said cylinder and said piston to drive said rack and move said movable head incremental spacings toward and away from said fixed head; and
   g. drive means coacting between said cylinder and said support means to rotate said cylinder, said piston and said heads to accommodate cutting and clinching component leads having variable angular dispositions.

2. The mechanism of claim 1 wherein said drive means comprises a rack carried on said support means and a pinion carried on said cylinder, said drive means including means to drive said rack to rotate said pinion.

3. The mechanism of claim 1 wherein said mounting of said fixed head on said movable head comprises a rail means supporting said movable head on said fixed head.

4. The mechanism of claim 1 including pneumatic means associated with said piston and said cylinder to raise said piston and move said heads adjacent the printed circuit board.

5. The mechanism of claim 4 including return springs positioned between said piston and said cylinder to lower said heads away from the board.

6. The mechanism of claim 1 including lock means coacting with said drive means to orient said heads in 90° increments.

7. The mechanism of claim 1 including brake means associated with said driven shaft to lock said shaft and thus said movable head against movement.

8. The mechanism of claim 1 including a bidirectional drive for said driven shaft.

* * * * *